(12) United States Patent
Muchherla et al.

(10) Patent No.: US 11,450,391 B2
(45) Date of Patent: Sep. 20, 2022

(54) MULTI-TIER THRESHOLD VOLTAGE OFFSET BIN CALIBRATION

(71) Applicant: Micron Technology, Inc., Boise, ID (US)

(72) Inventors: Kishore Kumar Muchherla, Fremont, CA (US); Shane Nowell, Boise, ID (US); Mustafa N. Kaynak, San Diego, CA (US); Karl D. Schuh, Santa Cruz, CA (US); Jiangang Wu, Milpitas, CA (US); Devin M. Batutis, San Jose, CA (US); Xiangang Luo, Fremont, CA (US)

(73) Assignee: Micron Technology, Inc., Boise, ID (US)

( * ) Notice: Subject to any disclaimer, the term of this patent is extended or adjusted under 35 U.S.C. 154(b) by 94 days.

(21) Appl. No.: 16/948,359

(22) Filed: Sep. 15, 2020

(65) Prior Publication Data
US 2022/0084605 A1 Mar. 17, 2022

(51) Int. Cl.
| | |
|---|---|
| *G11C 16/26* | (2006.01) |
| *G11C 16/34* | (2006.01) |
| *G06F 3/06* | (2006.01) |
| *G06F 11/07* | (2006.01) |
| *G11C 16/04* | (2006.01) |

(52) U.S. Cl.
CPC ............ *G11C 16/34* (2013.01); *G06F 3/0604* (2013.01); *G06F 3/0632* (2013.01); *G06F 3/0659* (2013.01); *G06F 3/0679* (2013.01); *G06F 11/076* (2013.01); *G06F 11/0727* (2013.01); *G06F 11/0793* (2013.01); *G11C 16/26* (2013.01); *G11C 16/0483* (2013.01)

(58) Field of Classification Search
CPC ...................................................... G11C 16/34
See application file for complete search history.

(56) References Cited

U.S. PATENT DOCUMENTS

| | | | |
|---|---|---|---|
| 2018/0033491 A1* | 2/2018 | Marelli | G11C 16/26 |
| 2018/0261275 A1* | 9/2018 | Takizawa | G11C 8/14 |

* cited by examiner

*Primary Examiner* — Min Huang
(74) *Attorney, Agent, or Firm* — Lowenstein Sandler LLP

(57) ABSTRACT

A system includes a memory device and a processing device. The processing device performs, at a first frequency, a first scan of a page of a block family that measures a first data state metric and identifies a specific bin corresponding to a measured value for the first data state metric. Processing device updates a bin, to which the page is assigned, to match the specific bin. Processing device performs, at a second frequency higher than the first frequency, a second scan of the page to measure a second data state metric for read operations performed using a threshold voltage offset value from each of multiple bins. Processing device updates the bin, to which the page is assigned for the specified die, to match a second bin having the threshold voltage offset value that yields a lowest read bit error rate from the second scan.

19 Claims, 12 Drawing Sheets

US 11,450,391 B2

MULTI-TIER THRESHOLD VOLTAGE OFFSET BIN CALIBRATION

TECHNICAL FIELD

Embodiments of the disclosure are generally related to memory sub-systems, and more specifically, are related to multi-tier threshold voltage offset bin calibration.

BACKGROUND

A memory sub-system can include one or more memory devices that store data. The memory devices can be, for example, non-volatile memory devices and volatile memory devices. In general, a host system can utilize a memory sub-system to store data at the memory devices and to retrieve data from the memory devices.

BRIEF DESCRIPTION OF THE DRAWINGS

The present disclosure will be understood more fully from the detailed description given below and from the accompanying drawings of some embodiments of the disclosure.

DETAILED DESCRIPTION

Figure 1:
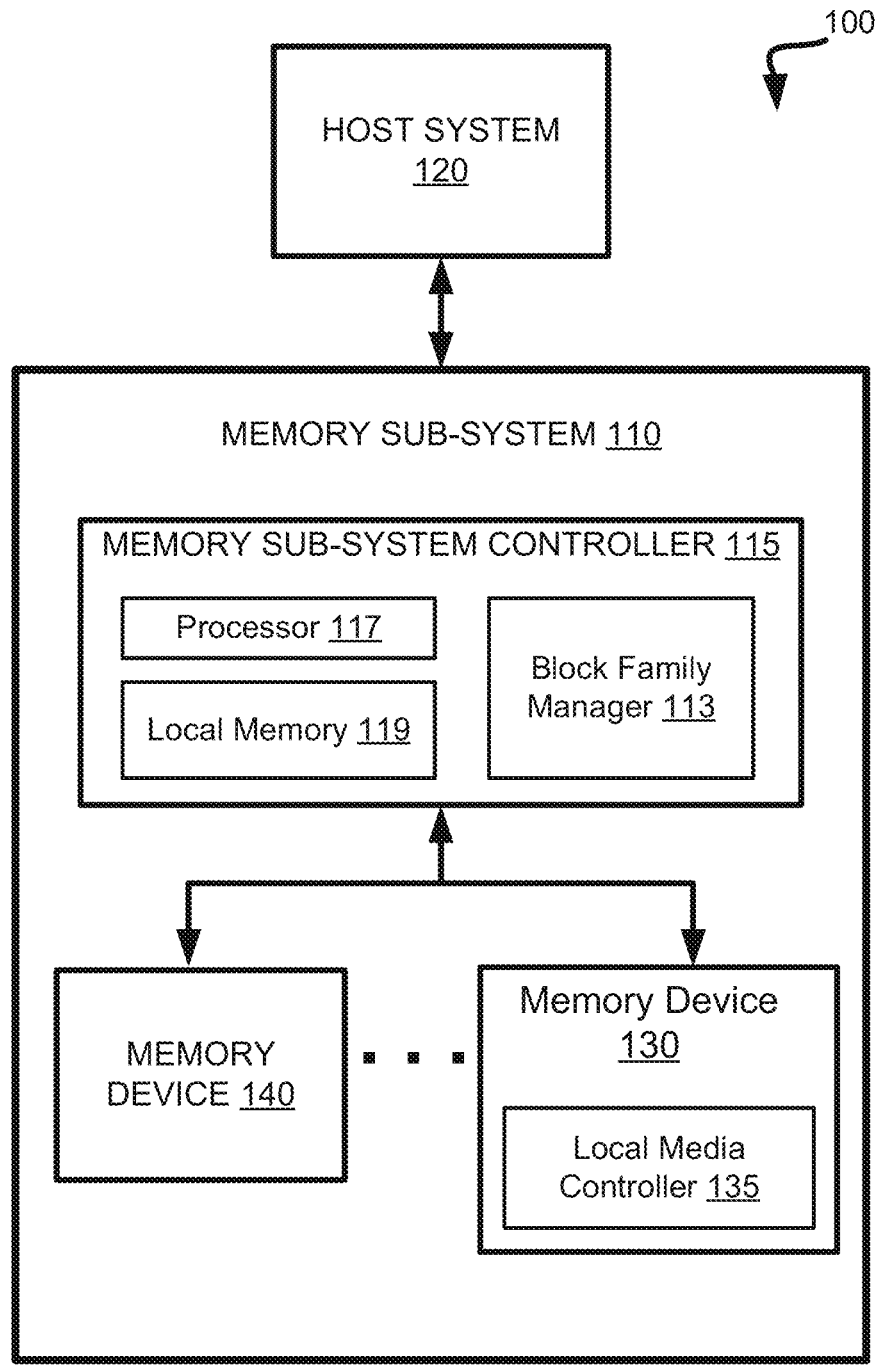
FIG. 1 illustrates an example computing system that includes a memory sub-system in accordance with some embodiments.

Embodiments of the present disclosure are directed to multi-tier threshold voltage offset bin calibration. A memory sub-system can be a storage device, a memory module, or a hybrid of a storage device and memory module. Examples of storage devices and memory modules are described below in conjunction with FIG. 1. In general, a host system can utilize a memory sub-system that includes one or more components, such as memory devices that store data. The host system can provide data to be stored at the memory sub-system and can request data to be retrieved from the memory sub-system.

A memory sub-system can utilize one or more memory devices, including any combination of the different types of non-volatile memory devices and/or volatile memory devices, to store the data provided by the host system. In some embodiments, non-volatile memory devices can be provided by negative-and (NAND) type flash memory devices. Other examples of non-volatile memory devices are described below in conjunction with FIG. 1. A non-volatile memory device is a package of one or more dice. Each die can consist of one or more planes. Planes can be groups into logic units (LUN). For some types of non-volatile memory devices (e.g., NAND devices), each plane consists of a set of physical blocks. A "block" herein refers to of a set of contiguous or non-contiguous memory pages. An example of a block is an erasable block, which is a minimal erasable unit of memory, while a page is a minimal writable unit of memory. Each page includes a set of memory cells ("cells"). A cell is an electronic circuit that stores information.

Data operations can be performed by the memory sub-system. The data operations can be host-initiated operations. For example, the host system can initiate a data operation (e.g., write, read, erase, etc.) on a memory sub-system. The host system can send access requests (e.g., write command, read command) to the memory sub-system, such as to store data on a memory device at the memory sub-system and to read data from the memory device on the memory sub-system. The data to be read or written, as specified by a host request, is hereinafter referred to as "host data." A host request can include logical address information (e.g., logical block address (LBA), namespace) for the host data, which is the location the host system associates with the host data.

A memory device includes multiple memory cells, each of which can store, depending on the memory cell type, one or more bits of information. A memory cell can be programmed (written to) by applying a certain voltage to the memory cell, which results in an electric charge being held by the memory cell, thus allowing modulation of the voltage distributions produced by the memory cell. Moreover, precisely controlling the amount of the electric charge stored by the memory cell allows to establish multiple threshold voltage levels corresponding to different logical levels, thus effectively allowing a single memory cell to store multiple bits of information: a memory cell operated with $2^n$ different threshold voltage levels is capable of storing n bits of information. "Threshold voltage" herein shall refer to the voltage level that defines a boundary between two neighboring voltage distributions corresponding to two logical levels. Thus, the read operation can be performed by comparing the measured voltage exhibited by the memory cell to one or more reference voltage levels in order to distinguish between two logical levels for single-level cells and between multiple logical levels for multi-level cells.

Due to the phenomenon known as slow charge loss, the threshold voltage of a memory cell changes in time as the electric charge of the cell degrades, which is referred to as "temporal voltage shift" (TVS), since the degrading electric charge causes the voltage distributions to shift along the voltage axis towards lower voltage levels. The threshold voltage is changing rapidly at first (immediately after the memory cell was programmed), and then slows down in an approximately logarithmic linear fashion with respect to the time elapsed since the cell programming event. Slow charge loss can also increase over time, with increasing temperature of memory cells as well as with increasing program erase cycles, among other factors. Accordingly, failure to mitigate the temporal voltage shift caused by the slow charge loss can result in the increased bit error rate in read operations.

Various common implementations, however, either fail to adequately address the temporal voltage shift or employ inefficient strategies resulting in high bit error rates and/or exhibiting other shortcomings. Embodiments of the present disclosure address the above-noted and other deficiencies by implementing a memory sub-system that employs block family based error avoidance strategies, thus significantly improving the bit error rate exhibited by the memory sub-system.

According to various embodiments, the temporal voltage shift is selectively tracked for a programmed set of memory cells grouped by block families, and appropriate voltage offsets, which are based on block affiliation with a certain block family, are applied to the base read levels in order to perform read operations. "Block family" herein shall refer to a possibly non-contiguous set of memory cells (which can reside in one or more full and/or partial blocks, the latter referred to as "partitions" herein) that have been programmed within a specified time window and temperature window, and thus are expected to exhibit similar or correlated changes in their respective data state metrics. A block family can be made with any granularity, containing only whole codewords, whole pages, whole super pages, or whole superblocks, or any combination of these. "Data state metric" herein shall refer to a quantity that is measured or inferred from the state of data stored on a memory device. Specifically, the data state metrics can reflect the state of the temporal voltage shift, the degree of read disturb, and/or other measurable functions of the data state as will be discussed in more detail. A composite data state metric is a function (e.g., a weighted sum) of a set of component state metrics.

In these embodiments, the memory sub-system controller evaluates a position metric or other data state metric of measures memory cells of a page or block to determine the location of a specified voltage level distribution corresponding to a specified logical level. This location can then be used to assign the page or block to a predefined threshold voltage offset bin, which includes a set of threshold voltage offset values that can be added to base read levels when performing a read operation. The page or block can be representative of a block family in some cases. "Base read level" herein shall refer to the initial threshold voltage level exhibited by the memory cell immediately after programming. In some implementations, base read levels can be stored in the metadata of the memory device. The associations of pages or blocks with block families and block families and dice with threshold voltage offset bins can be stored in respective metadata tables maintained by the memory sub-system controller. Since the time elapsed after programming and temperature are the main factors affecting the temporal voltage shift, all blocks and/or partitions within a single block family are presumed to exhibit similar distributions of threshold voltage levels in memory cells, and thus would require the same voltage offsets to be applied to the base read levels for read operations.

Proper assignments of pages, blocks, and/or block families to predefined threshold voltage offset bins results in lower read bit error rates (RBER). As discussed, because the memory cells experience slow charge loss, which affects the voltage level distributions, the controller can perform a memory scan periodically to check the location of the specified voltage level distribution for the pages or blocks, in order to calibrate assignments to the threshold voltage offset bins. Because of the multiple read commands required to perform a scan of many pages/blocks (to verify the accuracy of bin assignments across each die of multiple dice), the scan process is resource intensive at least in taking up bandwidth between the controller and the multiple dice of the memory device.

In various embodiments, the memory sub-system controller periodically performs a multi-tier threshold voltage offset bin calibration in which a less accurate, but more efficient, discretized measurement is performed more frequently than a more accurate, but less efficient, position metric measurement of pages. In this way, the calibration of bin assignments can be performed frequently without the bandwidth expense of measuring a voltage level distribution-based position metric within the memory cells for each scan.

In the various embodiments, to perform a high-frequency scan, the controller performs measurements of a position metric (e.g., type of data state metric) of a first specified voltage level distribution (e.g., a seventh voltage level distribution, or L7), a center of a valley of a second specified voltage level distribution (e.g., a sixth voltage level distribution, or L6) or of the first specified voltage level distribution (e.g., L7), a temporal voltage shift, a degree of read disturb, or the like. In some of these embodiments, the controller performs an auto read calibration (ARC) calculation using measurement data from the high-frequency scan to determine the center of this valley. An ARC read is a NAND feature that identifies where an ideal real level is within a valley of a voltage level distribution. The data state metric can further be a composite value of two or more measurements of different data state metrics.

Further, to perform a low-frequency scan, the controller can perform discretized calculations based on certain types of data state metric measurements. For example, a second data state metric can be measured for read operations performed using a threshold voltage offset value from each of multiple threshold voltage offset bins. The controller can then update the threshold voltage offset bin, to which the page is assigned for a particular die, to match a second threshold voltage offset bin having the threshold voltage offset value that yields a lowest read bit error rate from the low-frequency scan. In one embodiment, the second data state metric is read bit error rate (RBER), but other read-related data state metrics are envisioned.

Upon receiving a read command, the memory sub-system controller can identify the block family associated with the page or block identified by the logical block address (LBA) specified by the read command, identify the threshold voltage offset bin associated with the block family and die on which the page or block resides, compute the new threshold voltage by additively applying the threshold voltage offset associated with the threshold voltage offset bin to the base read level, and perform the read operation using the new threshold voltage.

Therefore, advantages of the systems and methods implemented in accordance with some embodiments of the present disclosure include, but are not limited to, improving the bit error rate in read operations by maintaining metadata that tracks groups of memory cells (as block families) that are presumed to exhibit similar voltage distributions and selectively performing calibration operations for limited subsets of memory cells based on their block family association. Further, because such tracking, storage, and calibration are performed on a block family basis as opposed to a per-block (or per-page) basis, processing, memory, and storage resources are preserved for host system usage. Other advantages will be apparent to those skilled in the art of memory allocation and error optimization within a memory sub-system discussed hereinafter.

FIG. 1 illustrates an example computing system 100 that includes a memory sub-system 110 in accordance with some embodiments of the present disclosure. The memory sub-system 110 can include media, such as one or more volatile memory devices (e.g., memory device 140), one or more non-volatile memory devices (e.g., memory device 130), or a combination of such.

A memory sub-system 110 can be a storage device, a memory module, or a hybrid of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) card, and a hard disk drive (HDD). Examples of memory modules include a dual in-line memory module (DIMM), a small outline DIMM (SO-DIMM), and various types of non-volatile dual in-line memory module (NVDIMM).

The computing system 100 can be a computing device such as a desktop computer, laptop computer, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device (e.g., a processor).

The computing system 100 can include a host system 120 that is coupled to one or more memory sub-systems 110. In some embodiments, the host system 120 is coupled to different types of memory sub-systems 110. FIG. 1 illustrates one example of a host system 120 coupled to one memory sub-system 110. As used herein, "coupled to" or "coupled with" generally refers to a connection between components, which can be an indirect communicative connection or direct communicative connection (e.g., without intervening components), whether wired or wireless, including connections such as electrical, optical, magnetic, etc.

The host system 120 can include a processor chipset and a software stack executed by the processor chipset. The processor chipset can include one or more cores, one or more caches, a memory controller (e.g., NVDIMM controller), and a storage protocol controller (e.g., PCIe controller, SATA controller). The host system 120 uses the memory sub-system 110, for example, to write data to the memory sub-system 110 and read data from the memory sub-system 110.

The host system 120 can be coupled to the memory sub-system 110 via a physical host interface. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), a double data rate (DDR) memory bus, Small Computer System Interface (SCSI), a dual in-line memory module (DIMM) interface (e.g., DIMM socket interface that supports Double Data Rate (DDR)), Open NAND Flash Interface (ONFI), Double Data Rate (DDR), Low Power Double Data Rate (LPDDR), etc. The physical host interface can be used to transmit data between the host system 120 and the memory sub-system 110. The host system 120 can further utilize an NVM Express (NVMe) interface to access components (e.g., memory devices 130) when the memory sub-system 110 is coupled with the host system 120 by the PCIe interface. The physical host interface can provide an interface for passing control, address, data, and other signals between the memory sub-system 110 and the host system 120. FIG. 1 illustrates a memory sub-system 110 as an example. In general, the host system 120 can access multiple memory sub-systems via a same communication connection, multiple separate communication connections, and/or a combination of communication connections.

The memory devices 130,140 can include any combination of the different types of non-volatile memory devices and/or volatile memory devices. The volatile memory devices (e.g., memory device 140) can be, but are not limited to, random access memory (RAM), such as dynamic random access memory (DRAM) and synchronous dynamic random access memory (SDRAM).

Some examples of non-volatile memory devices (e.g., memory device 130) include negative-and (NAND) type flash memory and write-in-place memory, such as a three-dimensional cross-point ("3D cross-point") memory device, which is a cross-point array of non-volatile memory cells. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Each of the memory devices 130 can include one or more arrays of memory cells. One type of memory cell, for example, single level cells (SLC) can store one bit per cell. Other types of memory cells, such as multi-level cells (MLCs), triple level cells (TLCs), and quad-level cells (QLCs), can store multiple bits per cell. In some embodiments, each of the memory devices 130 can include one or more arrays of memory cells such as SLCs, MLCs, TLCs, QLCs, or any combination of such. In some embodiments, a particular memory device can include an SLC portion, and an MLC portion, a TLC portion, or a QLC portion of memory cells. The memory cells of the memory devices 130 can be grouped as pages that can refer to a logical unit of the memory device used to store data. With some types of memory (e.g., NAND), pages can be grouped to form blocks.

Although non-volatile memory devices such as 3D cross-point array of non-volatile memory cells and NAND type memory (e.g., 2D NAND, 3D NAND) are described, the memory device 130 can be based on any other type of non-volatile memory, such as read-only memory (ROM), phase change memory (PCM), self-selecting memory, other chalcogenide based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), negative-or (NOR) flash memory, and electrically erasable programmable read-only memory (EEPROM).

A memory sub-system controller 115 (or controller 115 for simplicity) can communicate with the memory devices 130 to perform operations such as reading data, writing data, or erasing data at the memory devices 130 and other such operations. The memory sub-system controller 115 can include hardware such as one or more integrated circuits and/or discrete components, a buffer memory, or a combination thereof. The hardware can include digital circuitry with dedicated (i.e., hard-coded) logic to perform the operations described herein. The memory sub-system controller 115 can be a microcontroller, special purpose logic circuitry (e.g., a field programmable gate array (FPGA), an application specific integrated circuit (ASIC), etc.), or other suitable processor.

The memory sub-system controller 115 can include a processor 117 (e.g., processing device) configured to execute instructions stored in a local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, etc. The local memory 119 can also include read-only memory (ROM) for storing micro-code. While the example memory sub-system 110 in FIG. 1 has been illustrated as including the controller 115, in another embodiment of the present disclosure, a memory sub-system 110 does not include a controller 115, and can instead rely upon external control (e.g., provided by an external host, or by a processor or controller separate from the memory sub-system).

In general, the memory sub-system controller 115 can receive commands or operations from the host system 120 and can convert the commands or operations into instructions or appropriate commands to achieve the desired access to the memory devices 130. The memory sub-system controller 115 can be responsible for other operations such as wear leveling operations, garbage collection operations, error detection and error-correcting code (ECC) operations, encryption operations, caching operations, and address translations between a logical address (e.g., logical block address (LBA), namespace) and a physical address (e.g., physical block address) that are associated with the memory devices 130. The memory sub-system controller 115 can further include host interface circuitry to communicate with the host system 120 via the physical host interface. The host interface circuitry can convert the commands received from the host system into command instructions to access the memory devices 130 as well as convert responses associated with the memory devices 130 into information for the host system 120.

In some implementations, memory sub-system 110 can use a striping scheme, according to which every the data payload (e.g., user data) utilizes multiple dice of the memory devices 130 (e.g., NAND type flash memory devices), such that the payload is distributed through a subset of dice, while the remaining one or more dice are used to store the error correction information (e.g., parity bits). Accordingly, a set of blocks distributed across a set of dice of a memory device using a striping scheme is referred herein to as a "superblock."

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the controller 115 and decode the address to access the memory devices 130.

In some embodiments, the memory devices 130 include local media controllers 135 that operate in conjunction with memory sub-system controller 115 to execute operations on one or more memory cells of the memory devices 130. An external controller (e.g., memory sub-system controller 115) can externally manage the memory device 130 (e.g., perform media management operations on the memory device 130). In some embodiments, a memory device 130 is a managed memory device, which is a raw memory device combined with a local controller (e.g., local controller 135) for media management within the same memory device package. An example of a managed memory device is a managed NAND (MNAND) device.

The memory sub-system 110 includes a block family manager 113 that can be used to implement the block family-based error avoidance strategies in accordance with embodiments of the present disclosure. In some embodiments, the controller 115 includes at least a portion of the block family manager 113. For example, the controller 115 can include a processor 117 (processing device) configured to execute instructions stored in local memory 119 for performing the operations described herein. In some embodiments, the block family manager 113 is part of the host system 120, an application, or an operating system. The block family manager 113 can manage block families associated with the memory devices 130, as described in more detail herein below.

Figure 2:
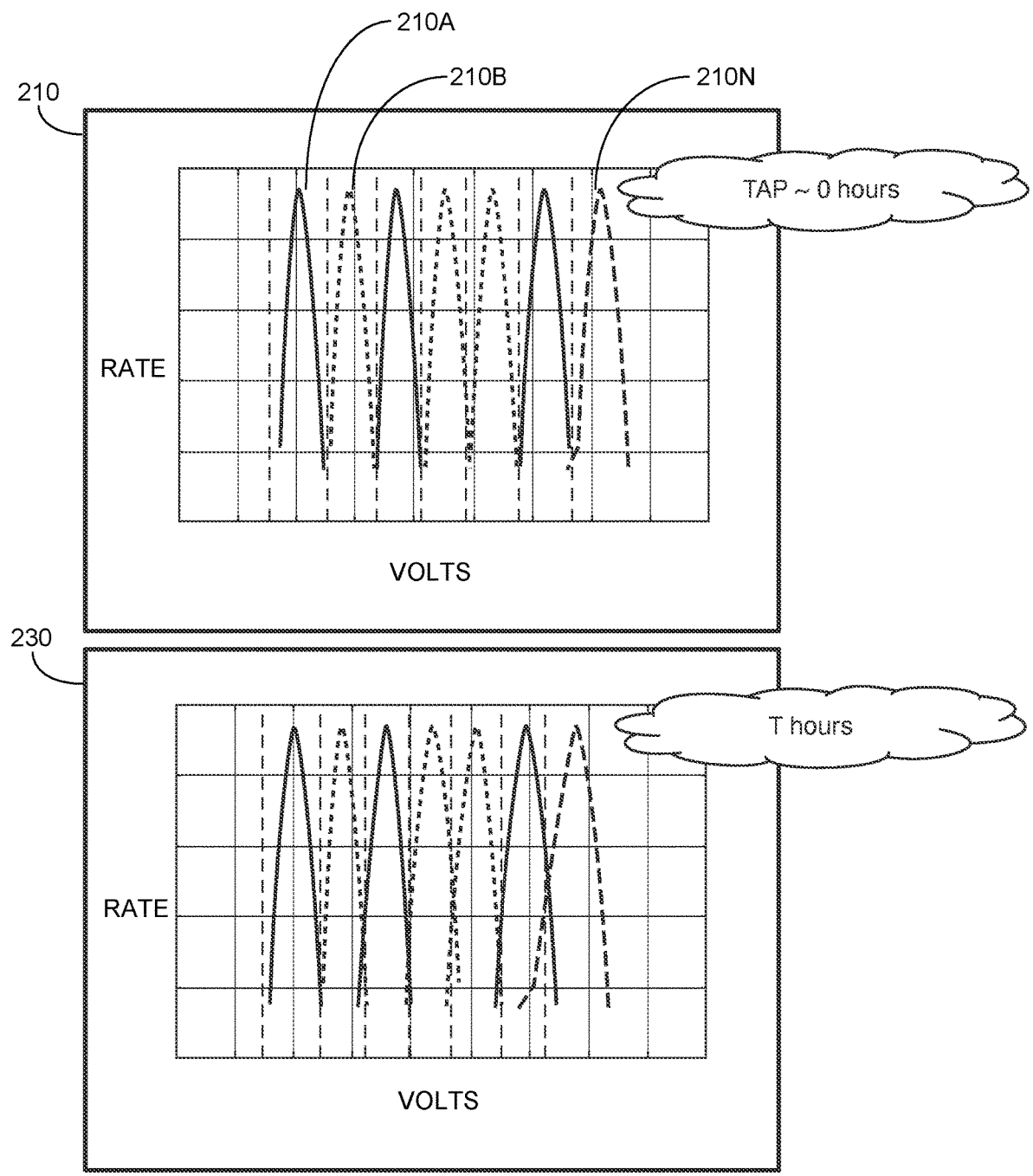
FIG. 2 is a set of graphs that illustrate a temporal voltage shift caused by the slow charge loss exhibited by triple-level memory cells, in accordance with some embodiments.

FIG. 2 is a set of graphs that illustrate a temporal voltage shift caused by the slow charge loss exhibited by triple-level memory cells, in accordance with some embodiments. While the illustrative example of FIG. 2 utilizes triple-level cells, the same observations can be made and, accordingly, the same remedial measures are applicable to single level cells and multi-level cells in order to compensate for the slow charge loss.

As noted herein above, a memory cell can be programmed (written to) by applying a certain voltage to the memory cell, which results in an electric charge being held by the memory cell, thus allowing modulation of the voltage distributions produced by the memory cell. Precisely controlling the amount of the electric charge stored by the memory cell allows to establish multiple threshold voltage levels corresponding to different logical levels, thus effectively allowing a single memory cell to store multiple bits of information: a memory cell operated with $2^n$ different threshold voltage levels is capable of storing n bits of information.

In FIG. 2, each graph illustrates a voltage distribution produced by memory cells programmed by a respective write level (which can be assumed to be at the midpoint of the distribution) to encode a corresponding logical level ("000" through "111" in case of a TLC). In order to distinguish between neighboring distributions (corresponding to two different logical levels), the threshold voltage levels (shown by dashed vertical lines) are defined, such that any measured voltage that falls below a threshold level is associated with one distribution of the pair of neighboring distributions, while any measured voltage that is greater than or equal to the threshold level is associated with another distribution of the pair of neighboring distributions.

The set of a graphs include a first graph 210 that reflects a time period immediately after programming and a second graph 230 that reflects a long time after programming. As seen by comparing the second graph 230 to the first graph 210, the voltage distributions change in time due to the slow charge loss, which results in drifting values of the threshold voltage levels (shown by dashed vertical lines). In various embodiments, this temporal voltage shift (TVS) is selectively tracked for programmed pages or blocks grouped by block families, and appropriate voltage offsets, which are based on page or block affiliation with a certain block family, are applied to the base read levels in order to perform read operations.

Figure 3:
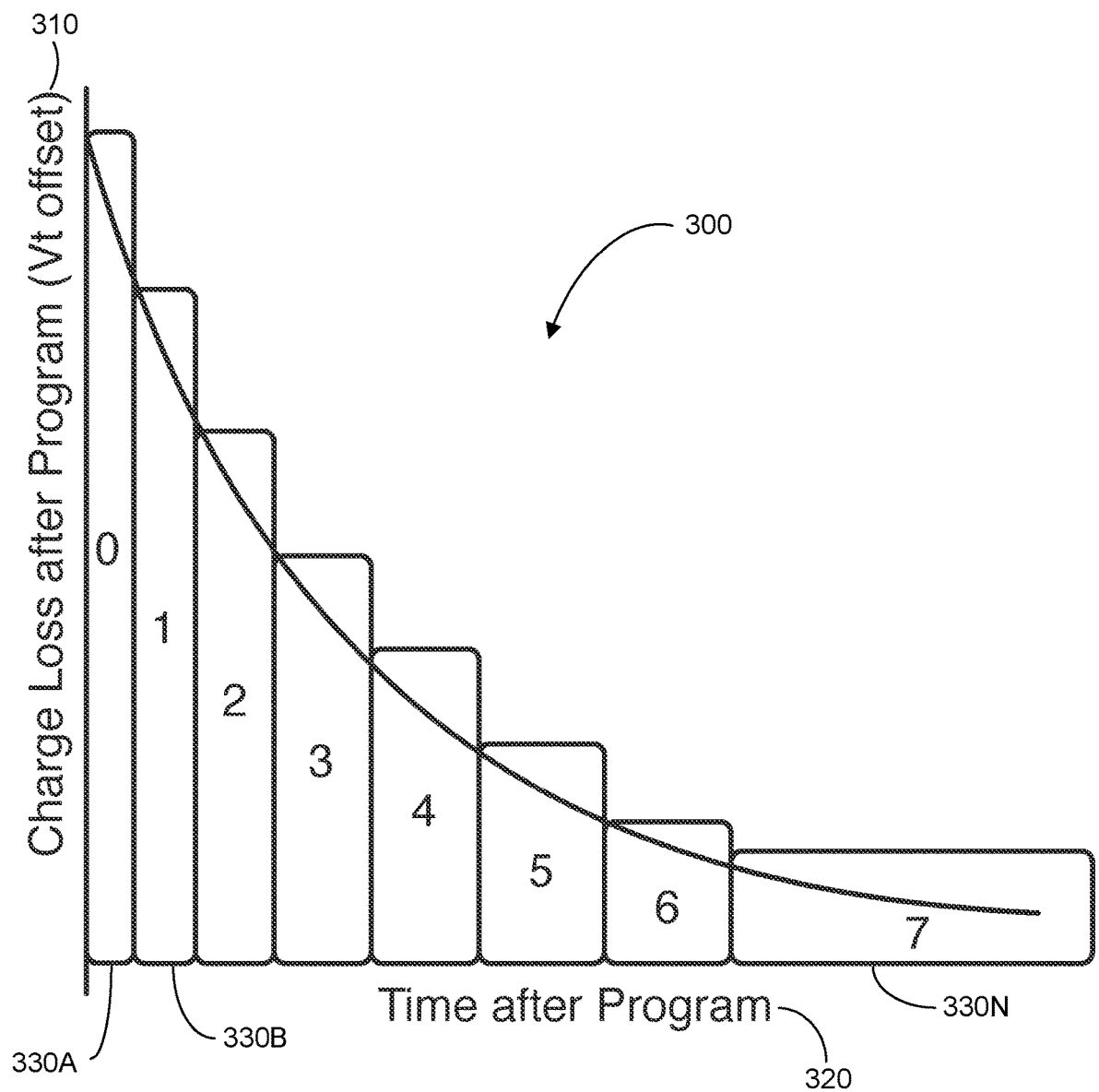
FIG. 3 is an example graph illustrating the dependency of a threshold voltage offset on the time after program, e.g., the period of time elapsed since a page had been programmed, in accordance with some embodiments.
Figure 4:
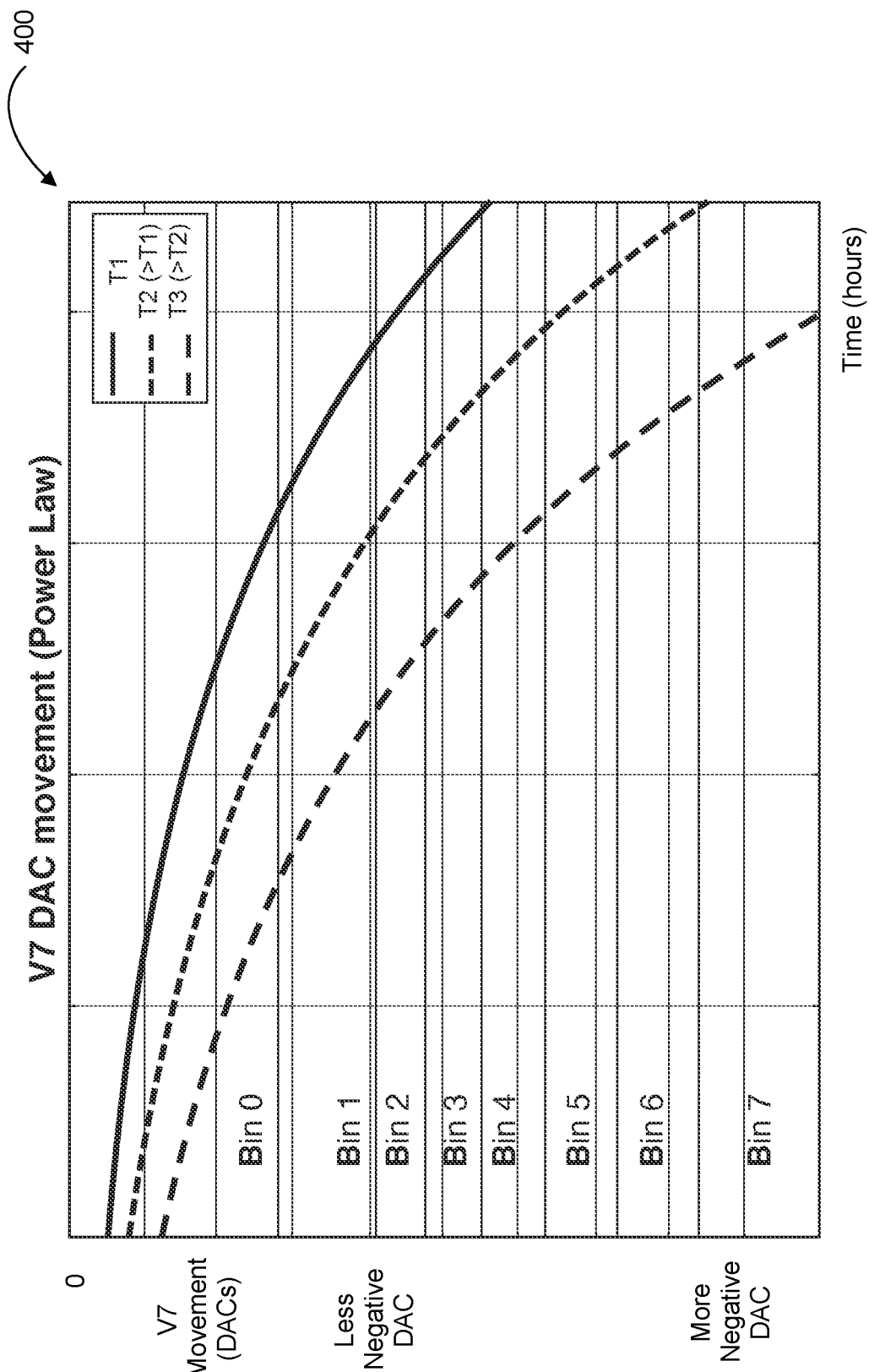
FIG. 4 is an example graph illustrating the dependency of the threshold voltage offset on both time after program and average temperature, in accordance with some embodiments.

FIG. 3 is an example graph 300 illustrating the dependency of a threshold voltage offset 310 on the time after program 320, e.g., the period of time elapsed since a page had been programmed, in accordance with some embodiments. FIG. 4 is an example graph 400 illustrating the dependency of the threshold voltage offset on both time after program (TAP) and average temperature, in accordance with some embodiments. As schematically illustrated by FIG. 3, pages or blocks (or groups of memory cells at another granularity) of the memory device are grouped into block families 330A-330N, such that each block family includes one or more pages or blocks that have been programmed within a specified time window, potentially varied by average temperature while the block family is open (FIG. 4). As noted herein above, since the time elapsed after programming and temperature are the main factors affecting the temporal voltage shift, all pages, blocks, and/or partitions within a single block family are presumed to exhibit similar distributions of threshold voltages in memory cells, and thus would require the same voltage offsets for read operations as time passes.

Block families can be created asynchronously with respect to page programming events. In an illustrative example, the memory sub-system controller 115 of FIG. 1 can create a new block family whenever a specified period of time (e.g., a predetermined number of minutes) has elapsed since creation of the last block family, which time period can vary significantly depending on an average temperature associated with pages during programming. More specifically, the entire asymptotic curve illustrated in FIG. 3 can be shifted to have a steeper curve with respect to time, as illustrated in FIG. 4, as average temperature increases. In FIG. 4, the curve associated with T1 decreases with time at a much slower rate (e.g., about 100 times slower) compared to the curve associated with T3. The curves in FIG. 4 look differently from the curve in FIG. 3 due to being graphed at log 10 scale in order to illustrate the difference in slow charge loss as temperature varies. Slow charge loss is illustrated along the vertical access for the seventh valley (V7) based on digital-to-analog (DAC) converted voltage values, also referred to as DACs. Each DAC can represent a certain number of millivolts (mV), here about 10 mV.

A newly created block family can be associated with bin 0, and each subsequently created block family can be associated with a sequentially numbered block family. Then, the memory sub-system controller can periodically perform a calibration process in order to associate each die of every block family with one of the predefines threshold voltage offset bins (e.g., bins 0-7 in the illustrative example of FIG. 3), which is in turn associated with the voltage offset to be applied for read operations. The associations of pages, blocks, and/or partitions with block families and block families and dice with threshold voltage offset bins can be stored in respective metadata tables maintained by the memory sub-system controller 115.

Figure 5:
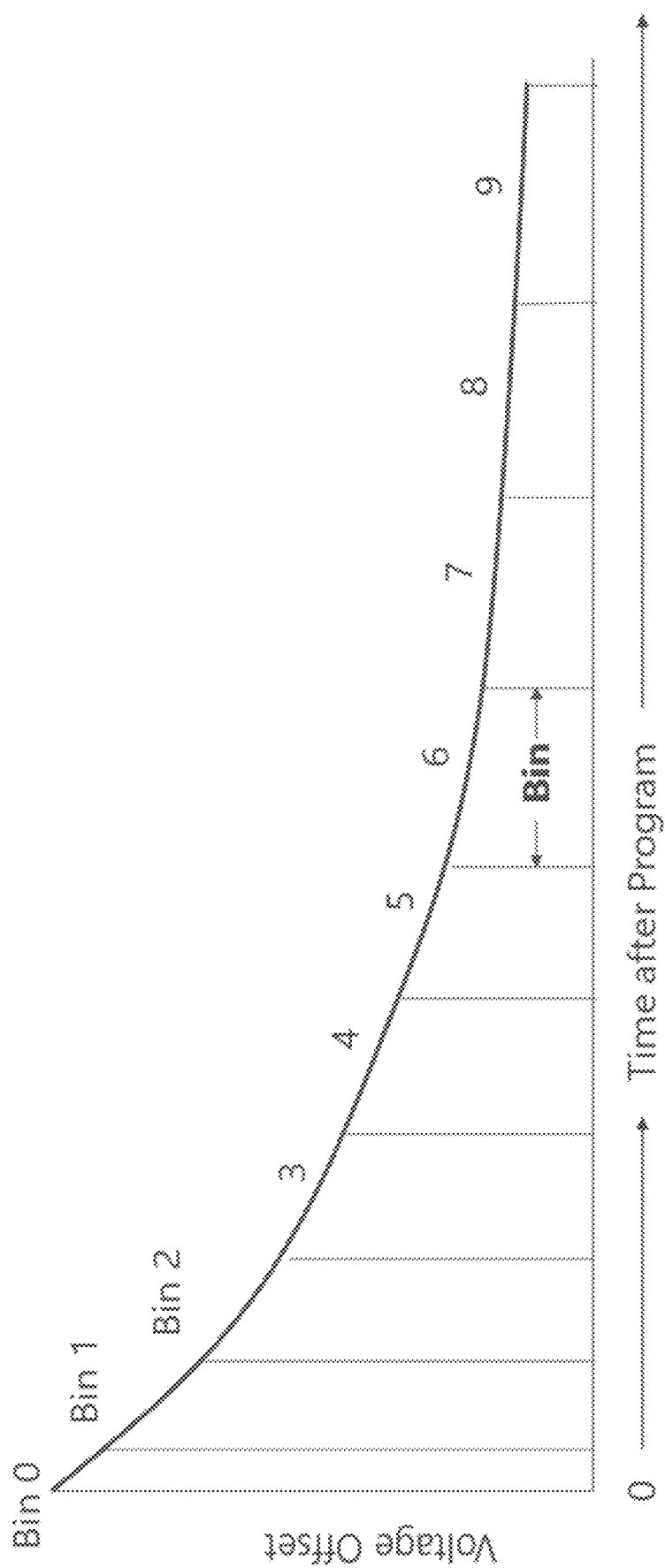
FIG. 5 is a graph that illustrates a set of predefined threshold voltage offset bins, in accordance with embodiments.

FIG. 5 is a graph that illustrates a set of predefined threshold voltage offset bins (bin 0 to bin 9), in accordance with some embodiments. As schematically illustrated by FIG. 5, the threshold voltage offset graph can be subdivided into multiple threshold voltage offset bins, such that each threshold voltage offset bin corresponds to a predetermined range of threshold voltage offset values. While the illustrative example of FIG. 5 defines ten bins, in other implementations, various other numbers of bins can be employed (e.g., 16, 32, 64 bins). Based on a periodically performed calibration process, the memory sub-system controller 115 can associate each die of every block family with a threshold voltage offset bin, which defines a set of threshold voltage offset values to be applied to the base voltage read level in order to perform read operations.

Figure 6:
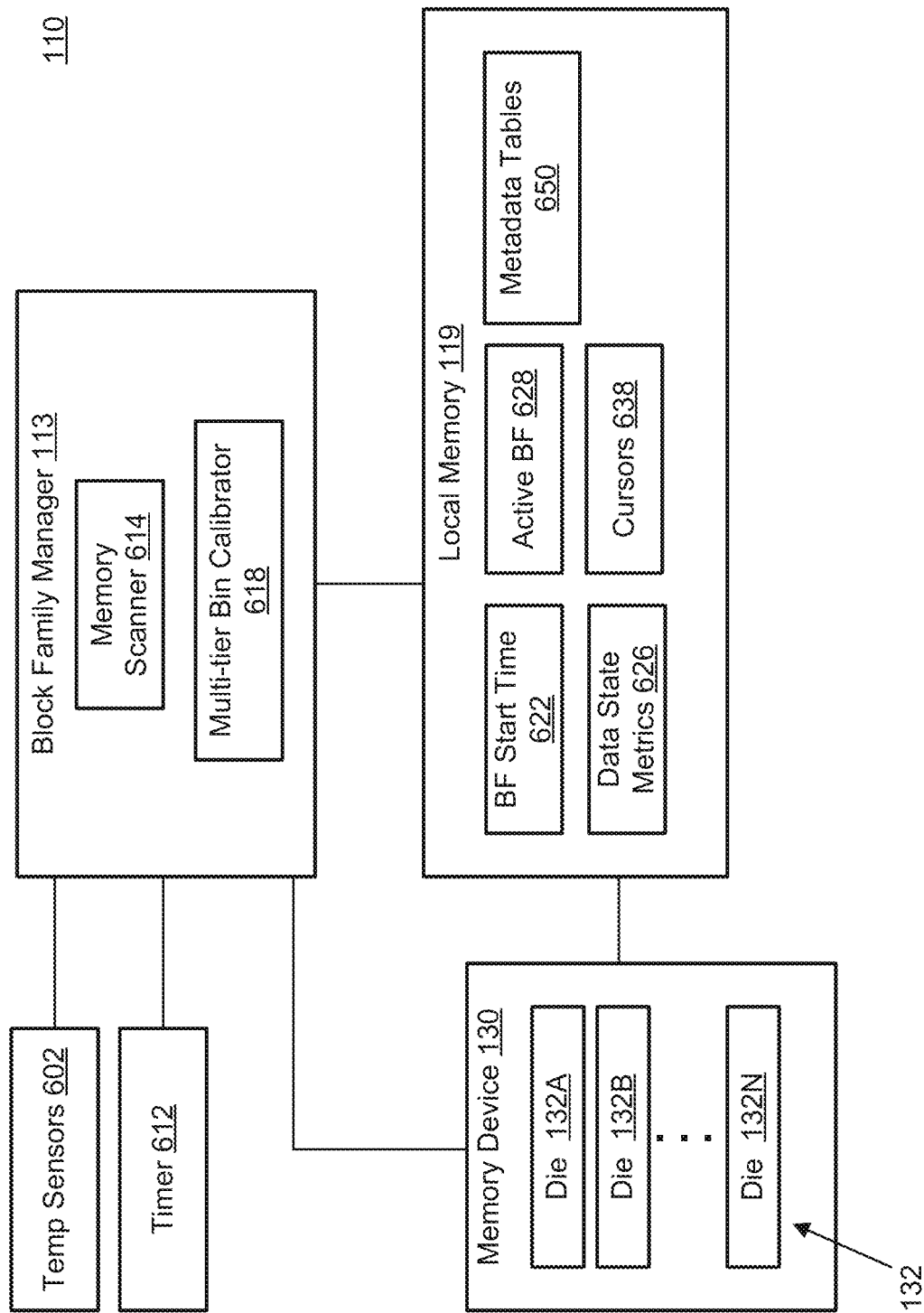
FIG. 6 is a block diagram that illustrates operation of a block family manager within the memory sub-system controller of FIG. 1 in accordance with various embodiments.

FIG. 6 is a block diagram that illustrates operation of the block family manager 113 within the memory sub-system controller 115 of FIG. 1 in accordance with various embodiments. In various embodiment, the memory sub-system can include temperature sensors 602 and a timer 612. In some embodiments, the timer 612 is located within the controller 115, whether within the processor 117, the block family manager 113, or elsewhere. The memory device 130 can include multiple dice 132, including a first die 132A, a second die 132B, . . . to include an Nth die 132N. The temperature sensors 602 can include, but not be limited to, a temperature sensor coupled to the controller 115, a temperature sensor coupled to a thermocouple, a temperature sensor located elsewhere within the memory sub-system 110, a temperature sensor at one die, of multiple dice of the memory device 130, and/or temperature sensors distributed across each of the multiple dice 132 of the memory device 130. Thus, the block family manager 113 can determine a temperature for or associated with a block family within the memory device 130 in different ways and at different granularities of the multiple dice 132.

The block family manager 113 can include a memory scanner 614 and a multi-tier bin calibrator 618, although other functionality of the block family manager 113 will be discussed with reference to managing and tracking block families throughout this disclosure. The local memory 119 can store a number of different items of information or data that will be discussed in more detail, including but not limited to, a block family (BF) start time 622, data state metrics 626, an active block family (BF) identifier 628, cursors 638 associated with the memory device 130, and a set of metadata tables 650.

More specifically, in various embodiments, the block family manager 113 can open a new block family after a previously created block family has been closed. At initiation of each block family, the block family manger 113 can initialize the timer 612 associated with a system clock. The system clock, for example, can be a clock maintained by the memory sub-system 110 and/or the host system 120. The time at which the block family is opened on the system clock can be stored as the BF start time 622. Thus, a time after program (TAP) can be determined with reference to the timer 612.

The block family manager 113 can further, using one or more of the temperature sensor(s) 602, measure an opening temperature of the memory device 130. This opening temperature can be stored in the local memory 119. As time passes while the controller 115 programs the BF of the memory device 130, the block family manager 113 can continuously calculate values for one or more of temperature metrics based on temperature values measured by the temperature sensor(s) 602.

The block family currently being programmed can be referred to as the active block family for which the active BF identifier 628 can be stored in the local memory 119 and utilized as the index for the metadata tables 650. For ease of tracking, each subsequently programmed block family can be assigned a sequentially numbered BF identifier, but other sequences and identifiers can also be used. The blocks families can also be associated with one or more of the cursors 638, e.g., at least an opening cursor and a closing cursor for each BF. "Cursor" herein shall broadly refer to a location on the memory device to which the data is being written.

In various embodiments, the block family manager 113 measures temporal voltage shift (TVS) or other data state metric of memory cells of a sampled page or block. Reference to a TVS value along with TAP, change in temperature, and/or program erase cycles can specify to which threshold voltage offset bin a unit of memory should be assigned. For example, the block family manager 113 can access the metadata tables 650 to determine which threshold voltage offset bin should be used for a particular read operation. As discussed with reference to FIGS. 3-4, as the TVS value for a BF shifts with increasing slow charge loss, the BF will be read with reference to bins with larger voltage offset values. These larger voltage offset values can come from higher-numbered bins, for example.

In some embodiments, to perform multi-tier bin calibration, the memory scanner 614 performs at least a low-frequency scan and a high-frequency scan at a higher frequency than performing the first scan. For example, the high-frequency scan can be performed two or more times (e.g., 10-15 times) between performing the low-frequency scan. As the more accurate and less efficient approach, the low-frequency scan can operate as a calibration to the high-frequency scan and corresponding assigning of threshold voltage offset bins to sampled pages or blocks. More specifically, the low-frequency scan can include updating threshold voltage offset values of the threshold voltage offset bins, which values can be employed in performing the high-frequency scan as will be discussed. To perform each of the low-frequency scan and the high-frequency scan, the memory scanner 614 measures at least one of the data state metrics 626 at a page or at multiple pages stored at a die of the memory device 130.

In corresponding embodiments, the multi-tier bin calibrator 618 can then assign (or verify the assignment of) a threshold voltage offset bin to the measured memory units (e.g., page(s), blocks, or block families) based on a comparison of the measured data state metric to state metric values corresponding to one or more threshold voltage offset value(s) within a set of threshold voltage offset bins. Over time, these state metric values (e.g., TVS) can shift and thus end up more closely correlating with the threshold voltage offset value(s) of a different bin. Thus, the block family manager 113 directs additional, periodic sampling to continue to calibrate the assignment of threshold voltage offset bins to these memory units, usually with the goal to assign each block family to a threshold voltage offset bin that minimizes RBER.

In some embodiments, the memory scanner 614 can issue read operations to multiple pages within the block family and/or to multiple blocks families in order to determine a composite value of the data state metric, such as averaged over the multiple pages. For example, the memory scanner 614 can measure data state metric(s) at sampled pages across planes, pages, and/or other LUNs and combine the measurement results for purposes of bin calibration. In some cases, the sampled pages are from a single block family, and in other cases, the sampled pages are from multiple block families that are adjacent to each other in terms of TAP. Utilizing a composite value of the data state metric(s) reduces the impact of localized workload artifacts such as read disturb and write temperatures, and can avoid the situation where a single unrepresentative page drives the assignment of a threshold voltage offset bin to a block family.

Figure 7:
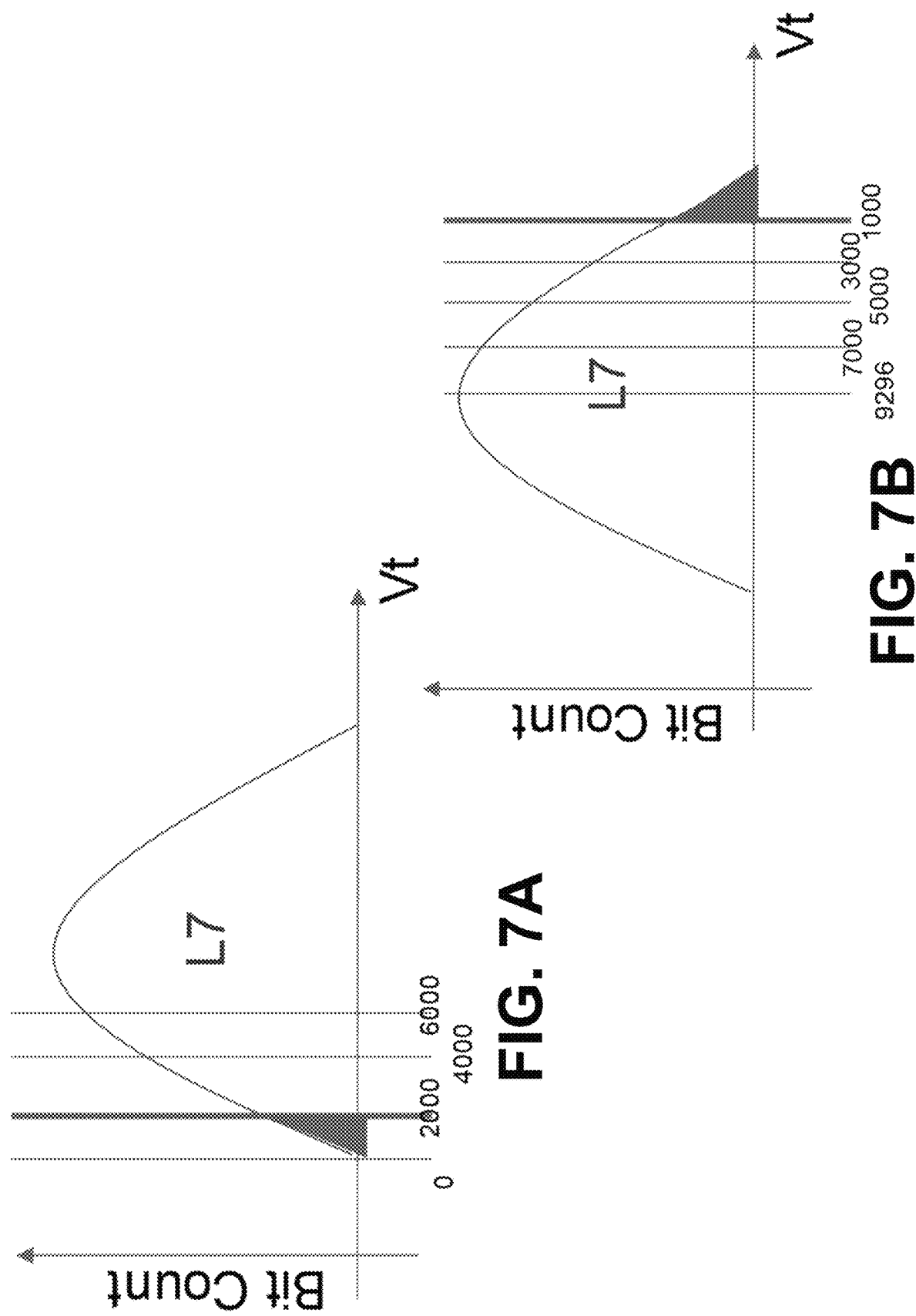
FIG. 7A is a graph that illustrates a measurement of a left position metric for a specified voltage level distribution, according to an embodiment.
FIG. 7B is a graph that illustrates a measurement of a right position metric for the specified voltage level distribution.

In various embodiments, the data state metrics 626 include a quantity that is measured or inferred from the behavior of data within the memory cells (e.g., of a page or block) of the block family. The data state metrics 626 reflect the voltage state of the data stored on the memory device 130. For example, to perform a high-frequency scan of multi-level cells, the memory scanner 614 can measure a position of a first specified voltage level distribution (e.g., a seventh voltage level distribution, or L7), a center of a valley of a second specified voltage level distribution (e.g., a sixth voltage level distribution, or L6) or of the first specified voltage level distribution, a fifth valley location, a seventh distribution median voltage, a temporal voltage shift, a degree of read disturb, or the like. The position metric can be measured by performing at least one of a soft bit read, a margin read, a read, or an extrapolation-based read of the memory cells. Other highly accurate, position-based measurements are envisioned, including at other tails or median locations of voltage level distributions and/or valleys therebetween. FIG. 7A and FIG. 7B provide examples of how position metrics for a seventh voltage level distribution (L7) can be determined for purposes of explanation.

FIG. 7A is a graph that illustrates a measurement of a left position metric for a specified voltage level distribution, according to an embodiment. For purposes of explanation, the specified voltage level distribution is the seventh voltage level distribution in multi-level cells. The left position metric can be identified by counting bits from the left and measuring the voltage level of the curve of the seventh voltage level distribution at 2,000 bits. Thus, the location of the left position metric can be located by counting 2,000 bits from the left-most boundary (or tail).

TABLE 1

| L7 tail range | Assigned Bins |
|---|---|
| A-B | Bin 0 |
| B-C | Bin 1 |
| C-D | Bin 2 |

FIG. 7B is a graph that illustrates a measurement of a right position metric for the specified voltage level distribution. The memory scanner 614 can perform a read voltage sweep at 40 millivolts (mV) or the like to find the right position metric for the seventh voltage level distribution, where a read voltage sweep measures more precisely a tail of voltage level distribution. Similar to the measurement of the left position metric (FIG. 7A), the memory scanner 614 can count bits to 1,000 bits from the right tail of the seventh voltage level distribution to determine the location at which to measure the height of the voltage level curve associated with the right position metric. FIG. 7B illustrates the bit values ascending from the right and the 1,000-bit line associated with the right position metric. Table 1 illustrates sets of voltage ranges of the L7 tail that could correspond to a set of threshold voltage offset bins, as an explanatory example of how ranges along the L7 tail curve could correspond to different bins. In alternative embodiments, the position metric can be measured as a percentage (e.g., 2%, 4% or the like) of the voltage level distribution.

With continued reference to FIG. 6, the data state metric measured for the first scan can further be a composite value of two or more measurements of data state metric including one or more voltage level distribution-based position metric and at least one of a time after program (TAP), a change in temperature of the memory device, read disturb, a temporal voltage shift, or the like. For example, position metric(s) can be augmented with TAP, where TAP can optionally be weighted by operating temperature (which can be a current temperature or an average temperature increase or the like).

In some of these embodiments, the memory scanner 614 performs an auto read calibration (ARC) calculation using measurement data from the high-frequency scan to determine a center of a valley between threshold voltage distributions. An ARC read is a NAND feature that identifies where an ideal read level is within a valley of a voltage level distribution. In one embodiment, the ideal read level is located at the bottommost point of the valley where the error bits are minimized. Further, the memory scanner 614 can perform the ARC calculation multiple times on the measurement data. The multi-tier bin calibrator 618 can determine the read voltage offsets as a function of valley position by running multiple auto-calibration routines, for example.

In some embodiments, the memory scanner 614 further calibrates a set of read voltage offset values of the threshold voltage offset bin (e.g., determined to be associated with a sampled page) based on the measured value for the data state metric of the page measured in the first scan. This fine-tuning of the threshold voltage offset values can be associated with a single block family or multiple adjacent block families that are grouped sufficiently into the threshold voltage offset bin. In additional embodiments, the memory scanner 614 repeats the first scan for multiple pages previously associated with the threshold voltage offset bin, the multiple pages spanning across multiple planes of a specified die. The memory scanner 614 can further determine a composite measured value by combining the measured values of the particular read voltage level from each of the multiple pages. The multi-tier bin calibrator 619 can further calibrate a set of read voltage offset values of the threshold voltage offset bin based on the composite measured value for the data state metric of the multiple pages.

Further, to perform a low-frequency scan, the memory scanner 614 can perform discretized calculations based on certain types of data state metric measurements. For example, another data state metric can be measured of a sampled page for read operations performed using a threshold voltage offset value from each of multiple threshold voltage offset bins. The multi-tier bin calibrator 618 can then update the threshold voltage offset bin, to which the page is assigned for a particular die, to match a second threshold voltage offset bin having the threshold voltage offset value that yields a lowest read bit error rate from the low-frequency scan. In one embodiment, the second data state metric is read bit error rate (RBER), but other read-related data state metrics are envisioned.

Figure 8:
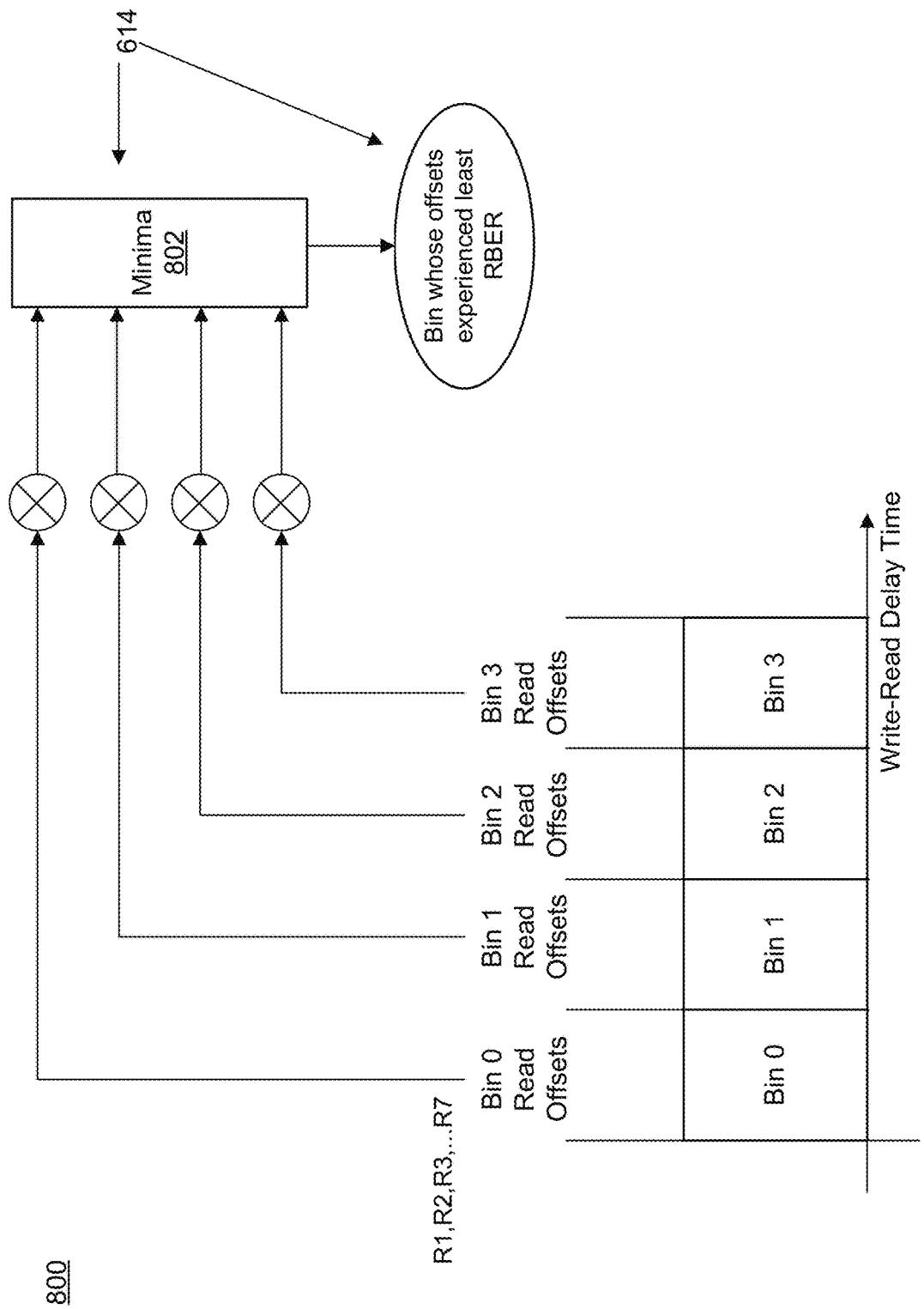
FIG. 8 is a schematic diagram that illustrates determination of which threshold voltage offset bin experiences the least read bit error rate for a particular data state metric measurement according to various embodiments.

FIG. 8 is a schematic diagram 800 that illustrates determination of which threshold voltage offset bin experiences the least read bit error rate for a particular data state metric measurement according to various embodiments. In these embodiments, the memory scanner 614 can measure another data state metric for read operations directed at sampled page(s) performed using a threshold voltage offset value from each of multiple threshold voltage offset bins. Illustrated in FIG. 8 are four threshold voltage offset bins, although more or fewer may be used, e.g., for any given block family. The other data state metric can be read bit error rate (RBER), but other read-related data state metrics are envisioned that impact RBER of read operations. The multi-tier bin calibrator 618 can further update the threshold voltage offset bin, to which the page is assigned for the sampled die, to match a second threshold voltage offset bin having the threshold voltage offset value that yields a lowest read bit error rate from the second scan. In some embodiments, this assignment can be expanded to the block of which the page is a part and/or the block family to which the page is a part.

More specifically, the memory scanner 614 can measure a read bit error rate for the read operations performed using each of multiple threshold voltage offset values (e.g., illustrated as R1, R2, R3, . . . R7) for each of the plurality of threshold voltage offset bins (Bin 0 through Bin 3). The threshold voltage offset values can be those define the boundary of each bin. The memory scanner 614 can further combine (illustrated by the circled X) the read bit error rates measured when using the multiple threshold voltage offset values to read data. When combined, these read bit error rates become a composite read bit error rate for each of the threshold voltage offset bins. The memory scanner 614 can further, within the minima component 802, identify the second threshold voltage offset bin as the threshold voltage offset bin that yields the lowest read bit error rate from among the composite read bit error rates. As mentioned, the multi-tier bin calibrator 618 can update the threshold voltage offset bin, to which the page is assigned, to match the second threshold voltage offset bin.

In some embodiments, this process is modified to perform multiple RBER measurements for each bin, and then use a statistic calculated on those multiple RBER measurements, e.g., a mean, a median, a minimum, a maximum, a quantile, or the like. The statistical result can then be compared to those of other threshold voltage offset bins to determine which bin yields the lowest RBER for a memory unit. This process can be expanded to measure multiple pages for a block family within the sampled die and using RBER quantiles or votes from the multiple pages from which to select one of the multiple threshold voltage offset bins. In this way, an outlier page that is sampled will not throw off the assigned threshold voltage off set bin that would be assigned otherwise had multiple pages been sampled before calibrating the bin.

In one embodiment, the memory scanner 614 repeats the second scan (e.g., high-frequency scan) for multiple pages of the block family at the specified die of the multiple dice 132, where the multiple pages span across multiple planes of the specified die. The memory scanner 614 can determine an aggregate read bit error rate by combining the read bit error rate for each of the multiple pages. The multi-tier bin calibrator 618 can update the threshold voltage offset bin, to which the block family is assigned for the specified die, to match one of the second or a third threshold voltage offset bin having the threshold voltage offset value that yields a lowest aggregate read bit error rate from the second scan.

Figure 9:
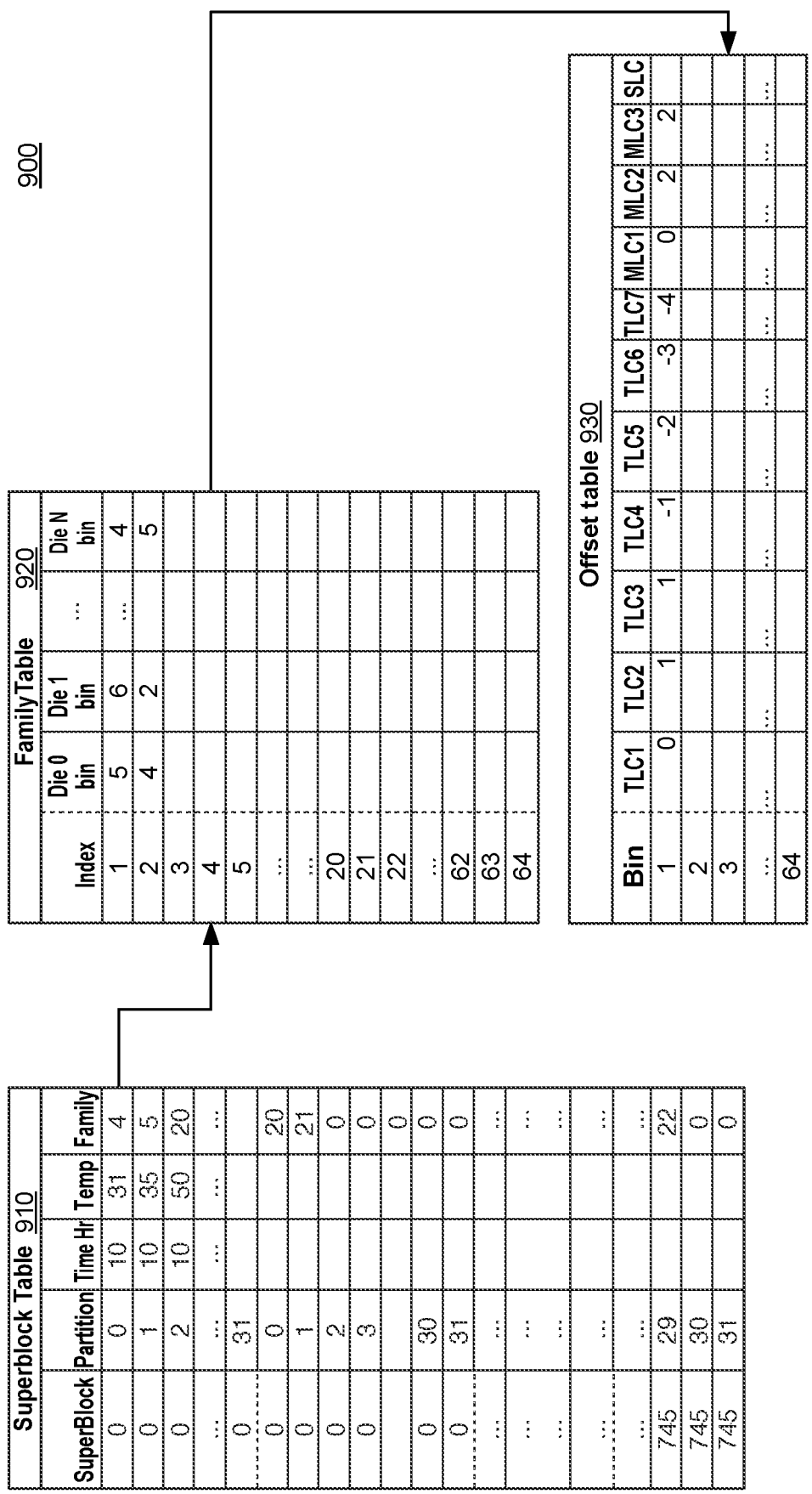
FIG. 9 is a graph that schematically illustrates metadata maintained by the memory sub-system controller for associating blocks and/or partitions with block families, in according with some embodiments.

FIG. 9 is a graph 900 that schematically illustrates metadata maintained by the memory sub-system controller for associating blocks and/or partitions with block families, in according with some embodiments. As schematically illustrated by FIG. 9, the memory sub-system controller can maintain the metadata tables 650 (FIG. 6) such as a superblock table 910, a block family table 920, and an offset table 930. Each record of the superblock table 910 specifies the block family associated with the specified superblock and partition combination. In some implementations, the superblock table records can further include time and temperature values associated with the specified superblock and partition combination.

The block family table 920 is indexed by the block family number, such that each record of the block family table 920 specifies, for the block family referenced by the index of the record, a set of threshold voltage offset bins associated with respective dies of the block family. In other words, each record of the block family table 920 includes a vector, each element of which specifies the threshold voltage offset bin associated with the die referenced by the index of the vector element. The threshold voltage offset bins to be associated with the block family dies can be determined by the calibration process, as described in more detail herein above.

Finally, the offset table 930 is indexed by the bin number. Each record of the offset table 930 specifies a set of threshold voltage offset values (e.g., for TLC, MLC, and/or SLC) associated with an threshold voltage offset bin and die combination.

In various embodiments, when the multi-bin calibrator 618 updates a threshold voltage offset bin to which a memory unit (e.g., page, block, partition, or block family) are assigned by way of bin calibration, the multi-bin calibrator 618 can update either the indexing from the superblock table 910 to a different vector of die-based bin pointers in the block family table 920 or update the vector itself in the block family table 920 (to which the memory unit is indexed) to include different values for the threshold voltage offset bin(s) depending on die. In either case, the result to update the pointer for the memory unit to the correct threshold voltage offset bin within the offset table 930 that includes the threshold voltage offset values that closest match a measured value of a data state metric and/or exhibit the lowest RBER during read operations.

The metadata tables 910-930 can be stored on one or more memory devices 130 of FIG. 1. In some implementations, at least part of the metadata tables can be cached in the local memory 119 of the memory sub-system controller 115 of FIG. 1.

In operation, upon receiving a read operation (e.g., command), the memory sub-system controller 115 determines the physical address corresponding to the logical block address (LBA) specified by the read command. Components of the physical address, such as the physical block number and the die identifier, are utilized for performing the metadata table walk: first, the superblock table 910 is used to identify the block family identifier corresponding to the physical block number; then, the block family identifier is used as the index to the block family table 920 in order to determine the threshold voltage offset bin associated with the block family and the die; finally, the identified threshold voltage offset bin is used as the index to the offset table 930 in order to determine the threshold voltage offset value corresponding to the threshold voltage offset bin. The memory sub-system controller can then additively apply the identified threshold voltage offset to the base voltage read level in order to perform the requested read operation.

In the illustrative example of FIG. 9, the superblock table 910 maps partition 0 of the superblock 0 to block family 4, which is utilized as the index to the block family table 920 in order to determine that die 0 is mapped to bin 3. The latter value is used as the index to the offset table in order to determine the threshold voltage offset values for bin 3.

Figure 10:
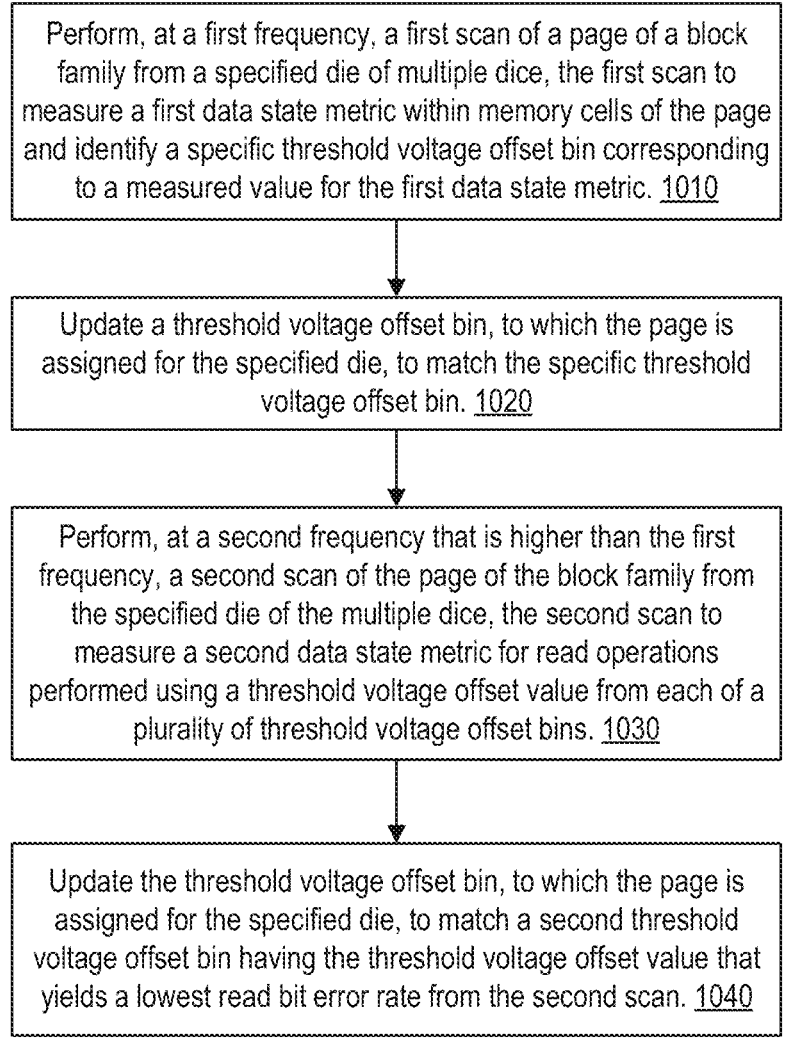
FIG. 10 is a flow diagram of an example method of multi-tier threshold voltage offset bin calibration, in accordance with some embodiments.

FIG. 10 is a flow diagram of an example method 1000 of multi-tier threshold voltage offset bin calibration, in accordance with some embodiments. The method 1000 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 1000 is performed by the block family manager 113 of FIG. 1. Although shown in a particular sequence or order, unless otherwise specified, the order of the operations can be modified. Thus, the illustrated embodiments should be understood only as examples, and the illustrated operations can be performed in a different order, while some operations can be performed in parallel. Additionally, one or more operations can be omitted in some embodiments. Thus, not all illustrated operations are required in every embodiment, and other process flows are possible.

At operation 1010, the processing logic performs, at a first frequency, a first scan of a page of a block family from a specified die of the multiple dice. The first scan (e.g., low-frequency scan) is to measure a first data state metric within memory cells of the page and identify a specific threshold voltage offset bin corresponding to a measured value for the first data state metric. The first data state metric can be a position metric of a specified voltage level distribution, or any number of data state metrics discussed herein, whether taken alone or in combination.

At operation 1020, the processing logic updates a threshold voltage offset bin, to which the page is assigned for the specified die, to match the specific threshold voltage offset bin.

At operation 1030, the processing logic performs, at a second frequency that is higher than the first frequency, a second scan of the page of the block family from the specified die of the multiple dice. The second scan is to measure a second data state metric for read operations performed using a threshold voltage offset value from each of a plurality of threshold voltage offset bins. In one embodiment, the second data state metric is read bit error rate (RBER), but other read-related data state metrics are envisioned.

At operation 1040, the processing logic updates the threshold voltage offset bin, to which the page is assigned for the specified die, to match a second threshold voltage offset bin having the threshold voltage offset value that yields a lowest read bit error rate from the second scan.

Figure 11:
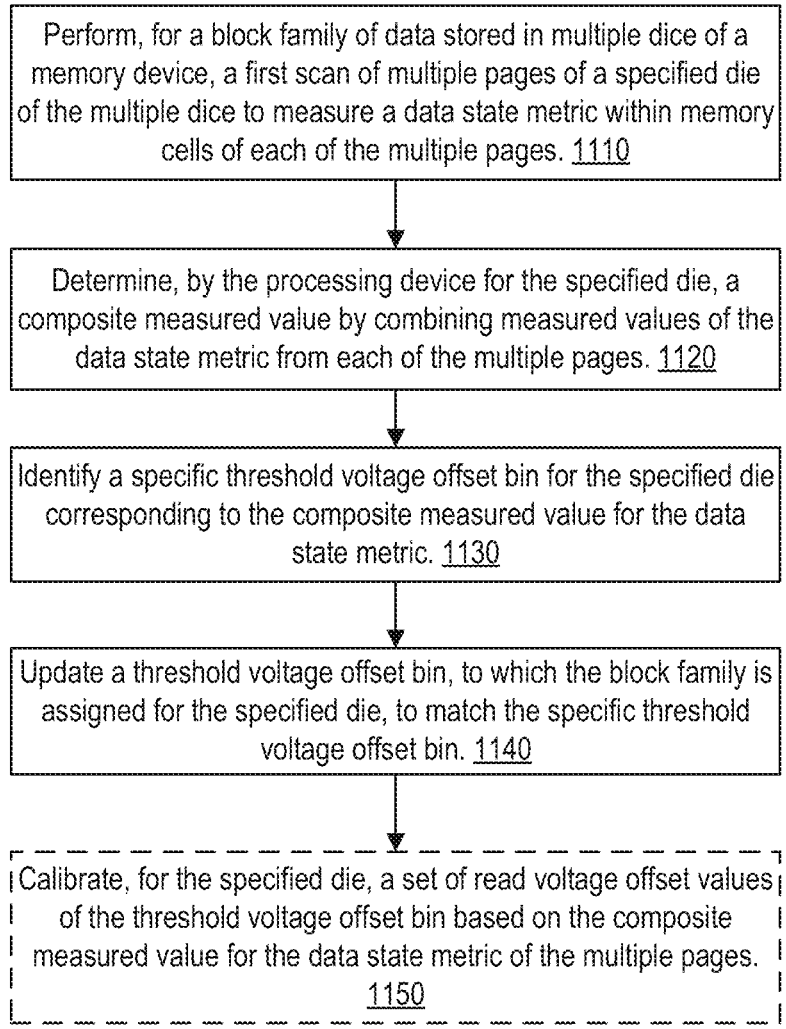
FIG. 11 is a flow diagram of an example method of a first scan of multi-tier threshold voltage offset bin calibration, in accordance with an embodiment.

FIG. 11 is a flow diagram of an example method 1100 of a first scan of multi-tier threshold voltage offset bin calibration, in accordance with an embodiment. The method 1100 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 1100 is performed by the block family manager 113 of FIG. 1. Although shown in a particular sequence or order, unless otherwise specified, the order of the operations can be modified. Thus, the illustrated embodiments should be understood only as examples, and the illustrated operations can be performed in a different order, while some operations can be performed in parallel. Additionally, one or more operations can be omitted in some embodiments. Thus, not all illustrated operations are required in every embodiment, and other process flows are possible.

At operation 1110, the processing logic performs, for a block family of data stored in multiple dice of a memory device, a first scan of multiple pages of a specified die of the multiple dice to measure a data state metric within memory cells of each of the multiple pages. The data state metric can be a position metric of a specified voltage level distribution or any other data state metric discussed herein. The processing logic can measure the data state metric(s) at sampled pages across planes, pages, and/or other LUNs and combine the measurement results for purposes of bin calibration. In some cases, the sampled pages are from a single block family, and in other cases, the sampled pages are from multiple block families, e.g., which can be generally understood to correlate to one or two adjacent threshold voltage offset bins.

At operation 1120, the processing logic determines, for the specified die, a composite measured value by combining measured values of the data state metric from each of the multiple pages. The data state metric measured for the first scan can further be a composite value of two or more measurements of data state metric including one or more voltage level distribution-based position metric and at least one of a time after program (TAP), a change in temperature of the memory device, read disturb, a temporal voltage shift, or the like. For example, position metric(s) can be augmented with TAP, where TAP can optionally be weighted by operating temperature (which can be a current temperature or an average temperature increase or the like).

At operation 1130, the processing logic identifies a specific threshold voltage offset bin for the specified die corresponding to the composite measured value for the data state metric. In this way, the identified threshold voltage offset bin is based on multiple pages and a composite value of the data state metric so that a single page, which could be an outlier, does not overly influence this assignment, and thus the ultimate RBER of read operations.

At operation 1140, the processing logic updates a threshold voltage offset bin, to which the block family is assigned for the specified die, to match the specific threshold voltage offset bin.

At operation 1150, the processing logic optionally calibrates, for the specified die, a set of read voltage offset values (e.g., R1, R2, R3 . . . R7) of the threshold voltage offset bin based on the composite measured value for the data state metric of the multiple pages. This calibration is therefore of the threshold voltage offset values that are stored in relation to the relevant (specific) threshold voltage offset bin, e.g., in the offset table 930 (FIG. 9). The composite measured value can further be adapted as a moving average of the composite measured value over time. In this way, the low-frequency scan provides some backwards calibration of the threshold voltage offset values that can then be employed in performing the second, or high-frequency, scan such as discussed with reference to FIG. 6 and FIG. 8.

The method 1100 can be extended so that the processing logic performs, at a second frequency that is higher than the first frequency, a second scan of each of the multiple pages. The second scan is to measure a read bit error rate for read operations performed using a threshold voltage offset value from each of multiple threshold voltage offset bins. The processing logic can further determine that each of the multiple pages corresponds to one of the first or a second threshold voltage offset bin corresponding to the threshold voltage offset value that yields the lowest read bit error rate. The processing logic can further determine an average threshold voltage offset bin by averaging a value identifying the first each second threshold voltage offset bin for the multiple pages. The processing logic can further update the threshold voltage offset bin for the specified die to which the block family is assigned corresponding to the averaged value.

Figure 12:
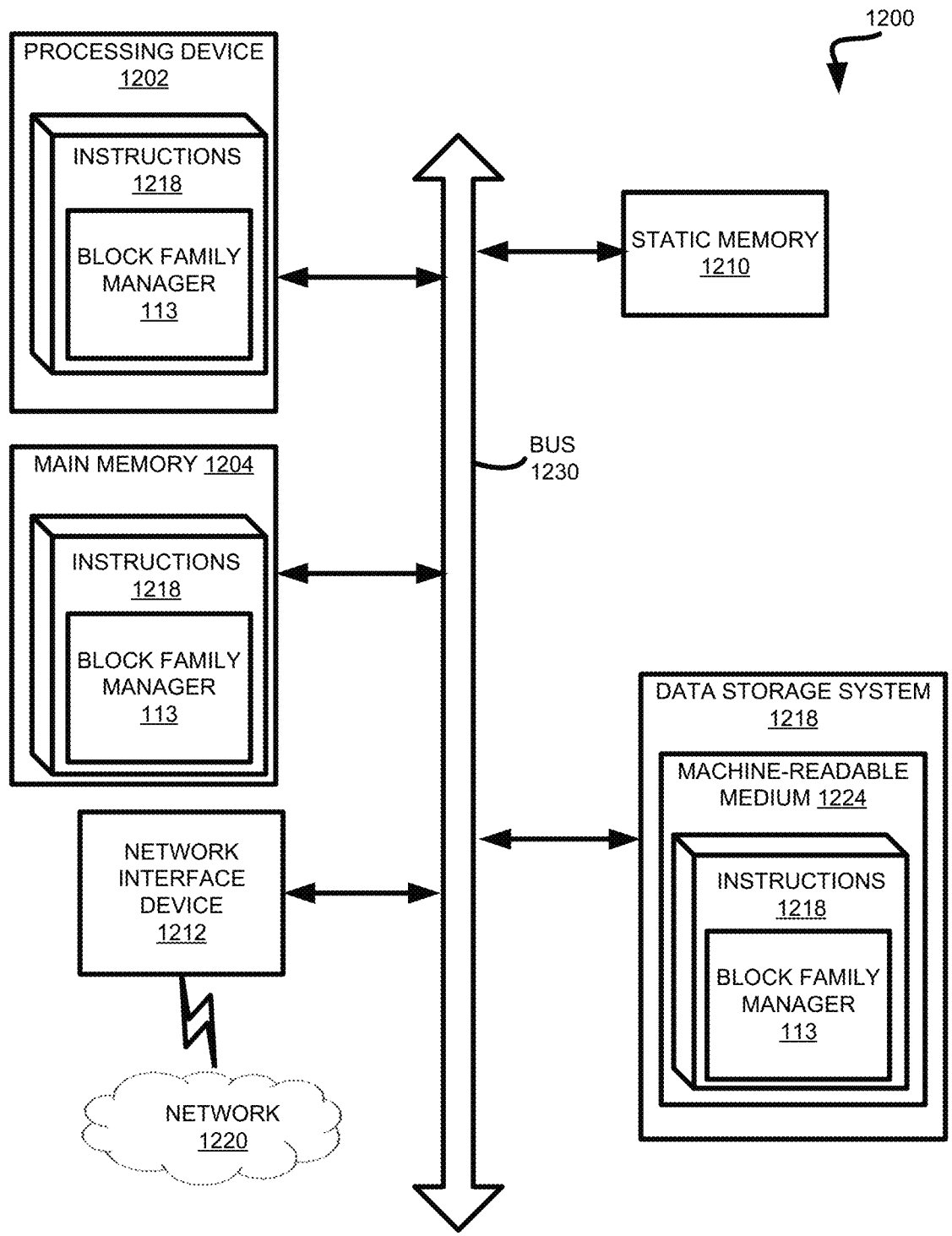
FIG. 12 is a block diagram of an example computer system in which embodiments of the present disclosure can operate.

FIG. 12 illustrates an example machine of a computer system 1200 within which a set of instructions, for causing the machine to perform any one or more of the methodologies discussed herein, can be executed. In some embodiments, the computer system 1200 can correspond to a host system (e.g., the host system 120 of FIG. 1) that includes, is coupled to, or utilizes a memory sub-system (e.g., the memory sub-system 110 of FIG. 1) or can be used to perform the operations of a controller (e.g., to execute an operating system to perform operations corresponding to the block family manager 113 of FIG. 1). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 1200 includes a processing device 1202, a main memory 1204 (e.g., read-only memory (ROM), flash memory, dynamic random access memory (DRAM) such as synchronous DRAM (SDRAM) or Rambus DRAM (RDRAM), etc.), a static memory 1210 (e.g., flash memory, static random access memory (SRAM), etc.), and a data storage system 1218, which communicate with each other via a bus 1230.

Processing device 1202 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 1202 can also be one or more special-purpose processing devices such as an application specific integrated circuit (ASIC), a field programmable gate array (FPGA), a digital signal processor (DSP), network processor, or the like. The processing device 1202 is configured to execute instructions 1228 for performing the operations and steps discussed herein. The computer system 1200 can further include a network interface device 1212 to communicate over the network 1220.

The data storage system 1218 can include a machine-readable storage medium 1224 (also known as a computer-readable medium) on which is stored one or more sets of instructions 1228 or software embodying any one or more of the methodologies or functions described herein. The instructions 1228 can also reside, completely or at least partially, within the main memory 1204 and/or within the processing device 1202 during execution thereof by the computer system 1200, the main memory 1204 and the processing device 1202 also constituting machine-readable storage media. The machine-readable storage medium 1224, data storage system 1218, and/or main memory 1204 can correspond to the memory sub-system 110 of FIG. 1.

In one embodiment, the instructions 1228 include instructions to implement functionality corresponding to the block family manager 113 of FIG. 1. While the machine-readable storage medium 1224 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory devices, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A system comprising:
a memory device comprising a plurality of dice; and
a processing device, operatively coupled to the memory device, the processing device to perform operations, comprising:
performing, at a first frequency, a first scan of a page of a block family from a specified die of the plurality of dice, the first scan to measure a first data state metric within memory cells of the page and identify a specific threshold voltage offset bin corresponding to a measured value for the first data state metric;
updating a threshold voltage offset bin, to which the page is assigned for the specified die, to match the specific threshold voltage offset bin;
performing, at a second frequency that is higher than the first frequency, a second scan of the page of the block family from the specified die of the plurality of dice, the second scan to measure a second data state metric for read operations performed using a threshold voltage offset value from each of a plurality of threshold voltage offset bins; and
updating the threshold voltage offset bin, to which the page is assigned for the specified die, to match a second threshold voltage offset bin having the threshold voltage offset value that yields a lowest read bit error rate from the second scan.

2. The system of claim 1, wherein the first data state metric comprises a position metric of a specified voltage level distribution, and wherein to measure the specified voltage level distribution, the operations comprise performing at least one of a soft bit read, a read, or an extrapolation-based read of the memory cells.

3. The system of claim 1, wherein the threshold voltage offset bin matches the second threshold voltage offset bin for the block family, the first scan is of a first page and the second scan is of a second page of the block family.

4. The system of claim 1, wherein the second data state metric comprises a read bit error rate.

5. The system of claim 1, wherein performing the second scan further comprises:

measuring a read bit error rate for the read operations performed using each of multiple threshold voltage offset values for each of the plurality of threshold voltage offset bins;

combining the read bit error rates for the multiple threshold voltage offset values to generate a composite read bit error rate for each of the plurality of threshold voltage offset bins; and identifying the second threshold voltage offset bin as the threshold voltage offset bin that yields the lowest read bit error rate from among the composite read bit error rates.

6. The system of claim 1, wherein the operations further comprise:

repeating the second scan for multiple pages of the block family at the specified die of the plurality of dice, wherein the multiple pages span across multiple planes of the specified die;

determining an aggregate read bit error rate by combining the read bit error rate for each of the multiple pages; and updating the threshold voltage offset bin, to which the block family is assigned for the specified die, to match one of the second or a third threshold voltage offset bin having the threshold voltage offset value that yields a lowest aggregate read bit error rate from the second scan.

7. The system of claim 1, wherein the operations further comprise calibrating a set of read voltage offset values of the threshold voltage offset bin based on the measured value for the first data state metric of the page.

8. The system of claim 1, wherein the operations further comprise:

repeating the first scan for multiple pages previously associated with the threshold voltage offset bin, the multiple pages spanning across multiple planes of the specified die;

determining a composite measured value by combining the measured values of the particular read voltage level from each of the multiple pages; and calibrating a set of read voltage offset values of the threshold voltage offset bin based on the composite measured value for the first data state metric of the multiple pages.

9. A method comprising:

performing, at a first frequency, for a block family of data stored in a plurality of dice of a memory device, a first scan of multiple pages of a specified die of the plurality of dice to measure a data state metric within memory cells of each of the multiple pages;

determining, for the specified die, a composite measured value by combining measured values of the data state metric from each of the multiple pages;

identifying, a specific threshold voltage offset bin for the specified die corresponding to the composite measured value for the data state metric;

updating, a first threshold voltage offset bin, to which the block family is assigned for the specified die, to match the specific threshold voltage offset bin;

performing, at a second frequency that is higher than the first frequency, a second scan of each of the multiple pages, the second scan to measure a read bit error rate for read operations performed using a threshold voltage offset value from each of a plurality of threshold voltage offset bins; and updating the threshold voltage offset bin, to which each of the multiple pages is assigned for the specified die, to match one of the first or a second threshold voltage offset bin having the threshold voltage offset value that yields a lowest read bit error rate from the second scan.

10. The method of claim 9, further comprising calibrating a set of read voltage offset values of the threshold voltage offset bin based on the composite measured value for the data state metric of the multiple pages.

11. The method of claim 9, wherein the data state metric comprises one of a position metric of a first specified voltage level distribution, a center of a valley associated with a second specified voltage level distribution or of the first specified voltage level distribution, a temporal voltage shift, or a degree of read disturb.

12. The method of claim 11, further comprising performing an auto read calibration (ARC) calculation using measurement data from the first scan to determine the center of the valley of the second specified voltage level distribution or of the first specified voltage level distribution.

13. The method of claim 9, wherein the data state metric further comprises a composite value of two or more measurements of the data state metric comprising a voltage level distribution-based position metric and at least one of a time after program, a change in temperature of the memory device, read disturb, or a temporal voltage shift.

14. The method of claim 9, wherein performing the second scan comprises:

measuring the read bit error rate for the read operations performed using each of multiple threshold voltage offset values for each of the plurality of threshold voltage offset bins;

combining the read bit error rates for the multiple threshold voltage offset values to generate a composite read bit error rate for each of the plurality of threshold voltage offset bins; and identifying the one of the first or the second threshold voltage offset bin as the threshold voltage offset bin that yields the lowest read bit error rate from among the composite read bit error rates.

15. The method of claim 9, further comprising:

determining an average threshold voltage offset bin by averaging a value identifying the first threshold voltage offset bin and each second threshold voltage offset bin for the multiple pages; and updating the threshold voltage offset bin for the specified die to which the block family is assigned corresponding to the averaged value.

16. A non-transitory computer-readable medium storing instructions, which when executed by a processing device of a sub-system memory controller, cause the processing device to perform a plurality of operations comprising:

performing, at a first frequency, a first scan of a page of a block family from a specified die of a plurality of dice, the first scan to measure a first data state metric within memory cells of the page and identify a specific threshold voltage offset bin corresponding to a measured value for the first data state metric;

updating a threshold voltage offset bin, to which the page is assigned for the specified die, to match the specific threshold voltage offset bin;

performing, at a second frequency that is higher than the first frequency, a second scan of the page of the block family from the specified die of the plurality of dice, the second scan to measure a second data state metric for read operations performed using a threshold voltage offset value from each of a plurality of threshold voltage offset bins; and updating the threshold voltage offset bin, to which the page is assigned for the specified die, to match a second threshold voltage offset bin having the threshold voltage offset value that yields a lowest read bit error rate from the second scan.

17. The non-transitory computer-readable medium of claim 16, wherein the first data state metric comprises a position metric of a specified voltage level distribution, and wherein measuring the specified voltage level distribution comprises performing at least one of a soft bit read, a margin read, or an extrapolation-based read of the memory cells.

18. The non-transitory computer-readable medium of claim 16, wherein second data state metric comprises a read bit error rate.

19. The non-transitory computer-readable medium of claim 16, wherein the plurality of operations further comprise calibrating a set of read voltage offset values of the threshold voltage offset bin based on the measured value for the first data state metric of the page.

* * * * *